United States Patent [19]
Sibata et al.

[11] Patent Number: 5,452,841
[45] Date of Patent: Sep. 26, 1995

[54] WIRE BONDING APPARATUS AND METHOD

[75] Inventors: Sinji Sibata, Toyota; Shuji Sakou, Okazaki; Akihiko Ogino, Chita, all of Japan

[73] Assignee: Nippondenso Co., Ltd., Kariya, Japan

[21] Appl. No.: 277,859

[22] Filed: Jul. 20, 1994

[30]  Foreign Application Priority Data

Jul. 23, 1993 [JP] Japan .................................. 5-182373

[51] Int. Cl.⁶ ........................... H01L 21/60; B23K 26/00
[52] U.S. Cl. ........................................ 228/180.5; 228/4.5
[58] Field of Search ................... 228/155, 180.5, 228/4.5; 156/73.2; 219/56.21, 121.63, 121.64; 437/209, 220

[56]  References Cited

U.S. PATENT DOCUMENTS 4,378,902  4/1983  Fedak ..................... 228/180.5

FOREIGN PATENT DOCUMENTS

| 107240 | 8/1980 | Japan | 228/180.5 |
|---|---|---|---|
| 59-78787 | 5/1984 | Japan . | |
| 2148795 | 6/1990 | Japan . | |
| 78146 | 3/1992 | Japan | 228/180.5 |

OTHER PUBLICATIONS

"Stabilized Long wire Bonding Technique", Research Disclosure, Jan. 1992, No. 333, Kenneth Mason Publications Ltd. England.

Journal of Nippondenso Technical Disclosure, No. 58–138.

Journal of Nippondenso Technical Disclosure, No. 58–131.

Journal of Nippondenso Technical Disclosure, No. 52–241.

*Primary Examiner*—Samuel M. Heinrich
*Attorney, Agent, or Firm*—Cushman, Darby & Cushman

[57]  ABSTRACT

A wire bonding apparatus and method which enable fully automatic wire bonding between a connecting electrode on a circuit board and an external lead terminal while saving space to prevent enlargement of the package size. The wire bonding method has the steps of welding one end of a ribbon shaped flat copper wire to the terminal (external lead terminal); welding the other end of the copper wire to the pad (connecting electrode) which is disposed at a level below the level of the terminal, while turning the intermediate portion of the copper wire on and around the cylindrical portion of the forming member which is disposed at a level above the terminal within the horizontal span between the pad and the terminal; and depressing the bent portion of the copper wire which has been bent by being turned around the cylindrical portion of the forming member down to a level below the level of the terminal so that the copper wire, within the vertical span between the pad and the terminal, is bent to form the first acute bend and then bent back to form the second acute bend and then extended to the pad.

15 Claims, 5 Drawing Sheets

WIRE BONDING APPARATUS AND METHOD

BACKGROUND OF THE INVENTION

1. Field of the Invention

The present invention relates to a wire bonding apparatus and also to a wire bonding method.

2. Description of the Related Art

FIG. 11 illustrates a conventional method of wire bonding in which a connecting electrode 22 on a circuit board 21 is wire-bonded by means of a wire 25 to an external lead terminal 24 which is provided on a package 23 and which is vertically and horizontally staggered from the electrode 22. If the wire bonding is done such as to minimize the length of the wire 25, the wire 25 may be abnormally stressed in the event that the relative positions of the electrode 22 and the terminal 24 to each other are changed due to a change in the ambient temperature, thus impairing the reliability of the whole device. In order to obviate this problem, hitherto, the wire 25 is slacked both in the vertical and horizontal directions so as to absorb any tension, as illustrated in FIGS. 12 and 13.

Vertical slacking of the wire 23 by a height H as illustrated in FIG. 12 requires an additional space for accommodating the slack height H, while horizontal slacking of the wire 25 by a length $L_1$ as illustrated in FIG. 13 requires an additional space for accommodating the slack length $L_1$, thus impairing the space factor. In the case of FIG. 13, the overall size of the package is undesirably increased due to increased distance $L_2$ between the connecting electrode 22 and the external lead terminal 24.

SUMMARY OF THE INVENTION

Accordingly, an object of the present invention is to provide a wire bonding apparatus and method which are improved to save the space to avoid enlargement of the package size while enabling fully automated wire-bonding connection between the connecting electrode on the circuit board and the external lead terminal.

To these ends, according to one aspect of the present invention, there is provided a wire bonding apparatus for laying a wire between spaced first and second connecting terminals so as to electrically interconnect both electrodes, comprising: wire supplying means for supplying the wire and laying the wire between the first and second electrodes; welding means for welding the wire to the connecting electrodes; and a wire forming means the position of which is adjustable independently from the wire supplying means, the wire forming means being located at a detouring position spaced apart from an imaginary straight line interconnecting the first and second electrodes and retains a portion of the wire laid between the first and second electrodes, the wire forming means being movable, after the wire is laid between the first and second connecting electrodes, so as to bring the portion of the wire from the detouring position to a position near the imaginary line, such that the wire is connected between the first and second connecting electrodes so as to have at least one bend.

According to another aspect of the present invention, there is provided a wire bonding method for electrically connecting, by means of a conductor wire, a connecting electrode on a circuit board and an external lead terminal of a package which are vertically and horizontally deviated from each other, the method comprising the steps of welding one end of the wire to one of the connecting electrode and the terminal; welding the other end of the wire to the other of the connecting electrode and the terminal, while turning the intermediate portion of the wire on and around a guide member which is disposed at a level above the higher one of the connecting electrode and the terminal within the horizontal span between the connecting electrode and the terminal; and depressing the bent portion of the wire which has been bent by being turned around the guide member down to a level below the higher one of the connecting electrode and the terminal so that the wire, within the vertical span between the connecting electrode and the terminal, is bent from one towards the other of the connecting electrode and the terminal to form a first acute bend and then bent back to form a second acute bend and then extended to the other of the connecting electrode and the terminal.

According to this method, the portion of the wire constituting the first bend can be disposed right above a point ah which the wire is welded to the other of the connecting electrode and the terminal.

The above and other objects, features and advantages of the present invention will become clear from the following description of the preferred embodiments when the same is read in conjunction with the accompanying drawings.

DESCRIPTION OF THE PREFERRED EMBODIMENTS

Preferred embodiments of the present invention will now be described with reference to the accompanying drawings.

Figure 1:
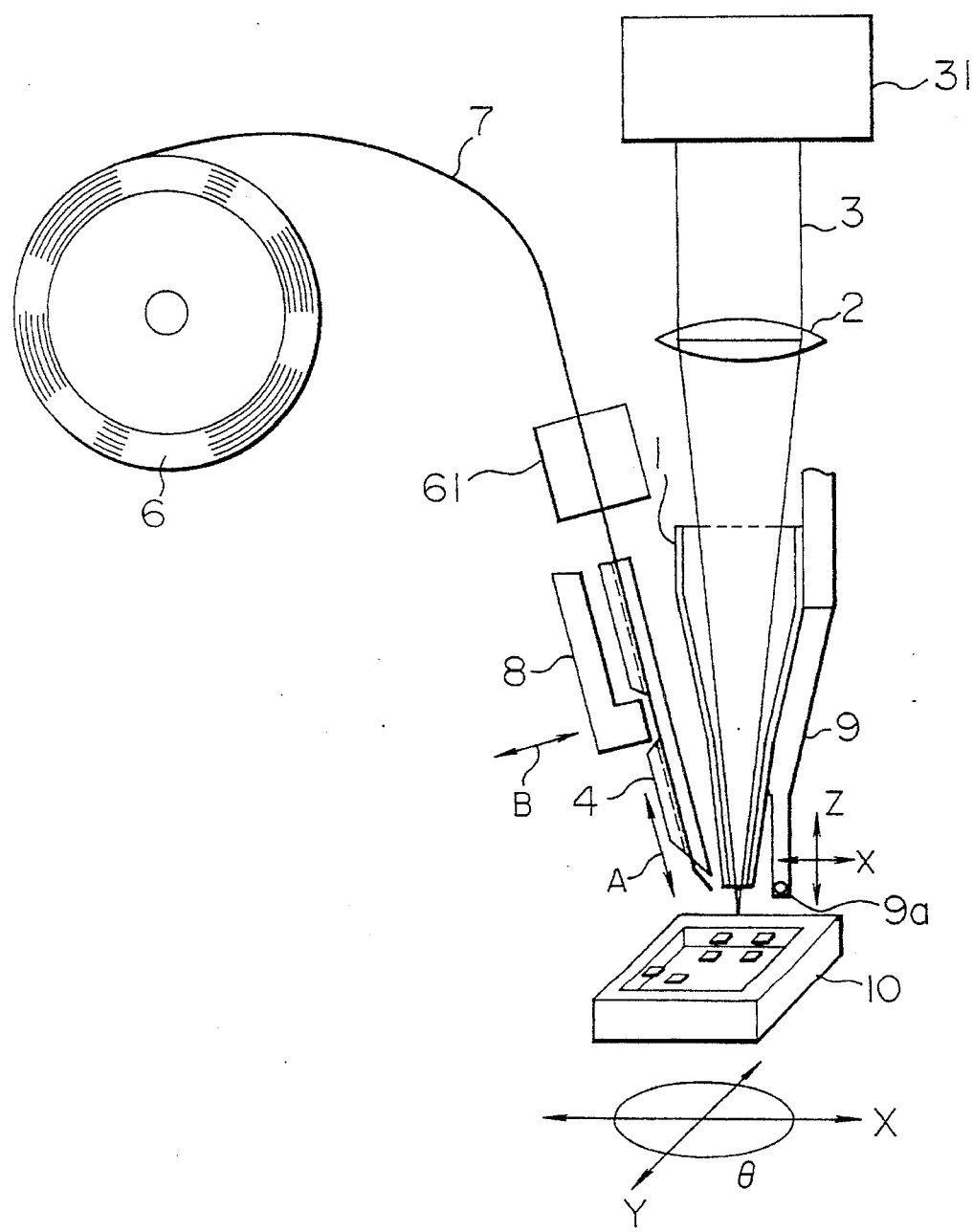
FIG. 1 is a schematic illustration of a wire bonding apparatus.

FIG. 1 schematically illustrates a wire bonding apparatus in accordance with the present invention.

The wire bonding apparatus has a nozzle 1 serving as a welding means. The nozzle 1 has a converging cylindrical form which reduces its diameter along its length towards the tip end which is the lower end as viewed in FIG. 1. The nozzle 1 has a function to bring the ribbon shaped flat copper wire 7 as the bonding wire into contact with a work. A condenser lens 2 is disposed above the nozzle 1. A laser beam 3 irradiated from a laser source 31 above the condenser lens 2 is condensed by the condenser lens 2 through the nozzle 1 so as to be emitted from the tip end of the nozzle 1.

Figure 2:
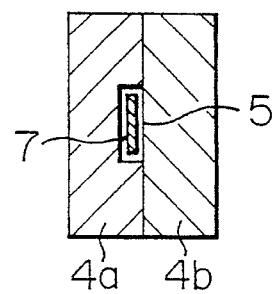
FIG. 2 is a sectional view of a cutter.

A cutter 4 serving as part of the wire supply means is spaced from the nozzle 1 at the left side of the latter. The cutter 4 has an end surface (lower end as viewed in FIG. 1) which is tapered towards the lower end extremity. A wire supply opening is formed to open in the tapered end surface of the cutter 4. As will be seen from FIG. 2, the cutter 4 is formed by joining a pair of members 4a and 4b to each other, one 4a of the members being recessed to provide a passage 5 for the copper wire.

Referring back to FIG. 1, the copper wire 7 is wound on a spool 6 and is pulled out therefrom fed through the passage 5 in the cutter 4 so as to emerge from the end of the cutter 4. The cutter 4 serves also as a guide for the copper wire 7 and is movable in the directions of the double-headed arrow A. The feed of the copper wire 7 is performed by a feeding mechanism 61.

The copper wire passage 5 in the cutter 4 is partly opened so as to partly expose the copper wire 7, and a copper wire fixing member 8 is pressed onto the exposed portion of the copper wire 7 so as to fix the copper wire 7 as necessitated. Thus, the wire fixing member 8 cooperates with the cutter 4 to clamp therebetween the copper wire 7. To this end, the wire fixing member 8 is movable towards and away from the cutter as indicated by a double-headed arrow B in FIG. 1.

A forming member 9, which is provided at its lower end as viewed in FIG. 1 with a cylindrical portion 9a serving as a guide ,is disposed at one side of the nozzle 1 leaving a space therebetween. The forming member 9 plays a double role of forming and strength checking. To this end, the forming member 9 is movable up and down (Z direction) and to the left and right (X direction).

A work 10 is fixed on a table which is movable both in X and Y directions and rotatable as indicated by θ. The nozzle 1, condenser lens 2, wire fixing member 8 and the forming member 9 are secured to a table which is movable in the Z direction.

Figure 10:
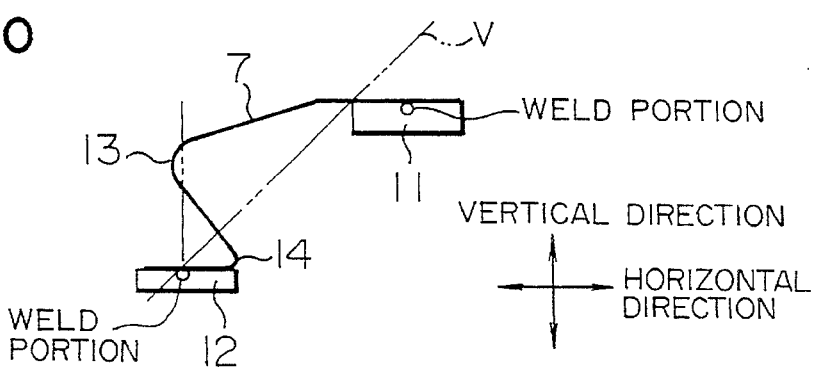
FIG. 10 is an illustration of a further step of the wire bonding process.
Figure 11:
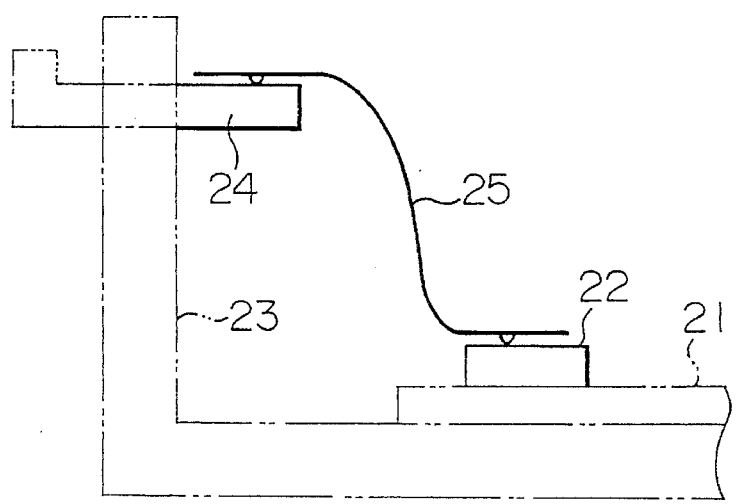
FIG. 11 is an illustration of a conventional wire bonding method.

As shown in FIG. 10, an external lead terminal 11 of a package is connected to a connecting electrode 12 on an HIC board (hybrid IC board) by means of a lead member which is constituted by the copper wire 7. The external lead terminal 11 and the connecting electrode 12 are deviated from each other both in the vertical and horizontal directions by predetermined distances. The configuration of the connecting wire as shown in FIG. 10 is adopted to relieve any thermal stress which occurs in the connecting portions.

A description will now be given of the wire bonding method in accordance with the present invention.

Figure 3:
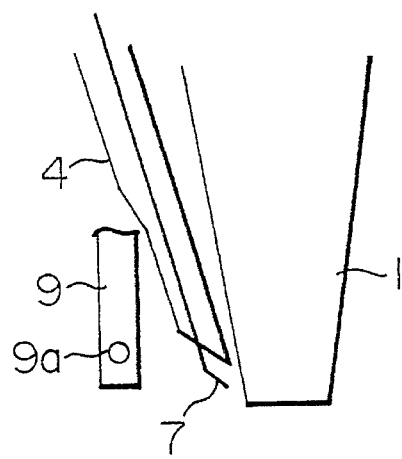
FIG. 3 is an illustration of a step of a wire bonding process.
Figure 3:
Figure 3:
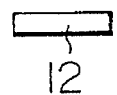

Referring first to FIG. 3, the external lead terminal 12 (referred to simply as "terminal 12", hereinafter) and the connecting electrode 12 on the IC board (referred to simply as "pad", hereinafter) are arranged at offset from each other both in the vertical and horizontal directions. More specifically, the terminal 11 is disposed above and at the right side of the pad 12.

The nozzle is stationed above the terminal 11 while the forming member 9 is located at the left side of the cutter as illustrated. This state will be referred to as "initial state" hereinafter.

Figure 4:
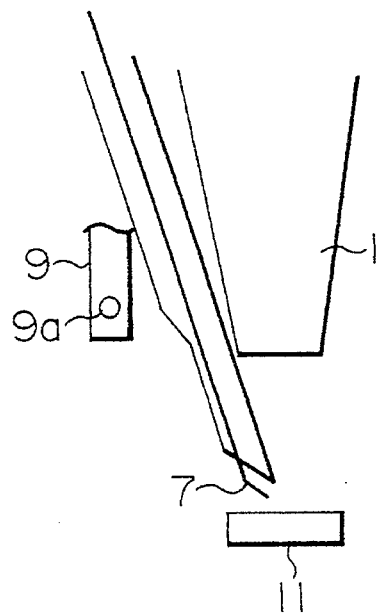
FIG. 4 is an illustration of the next step of the wire bonding process.
Figure 4:
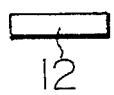

Then, the cutter 4, cooperating with the fixing member 8 in clamping the copper wire 7 therebetween, is lowered as indicated in FIG. 4.

Figure 5:
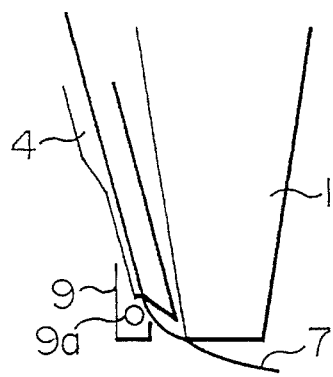
FIG. 5 is an illustration of another step of the wire bonding process.

Subsequently, the fixing member is moved to unclamp the copper wire 7 and the cutter 4 is moved upward to the initial position, as shown in FIG. 5. In this state, the forming member 9 has been moved to the right so as to locate its cylindrical portion 9a near the end of the cutter 4 so that the copper wire 7 is guided by the cylindrical portion 9a so as to be located immediately under the nozzle 1.

Figure 6:
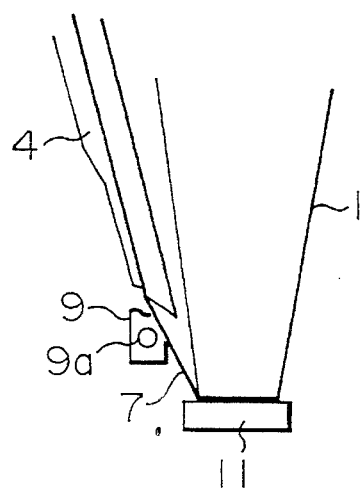
FIG. 6 is an illustration of a further step of the wire bonding process.
Figure 7:
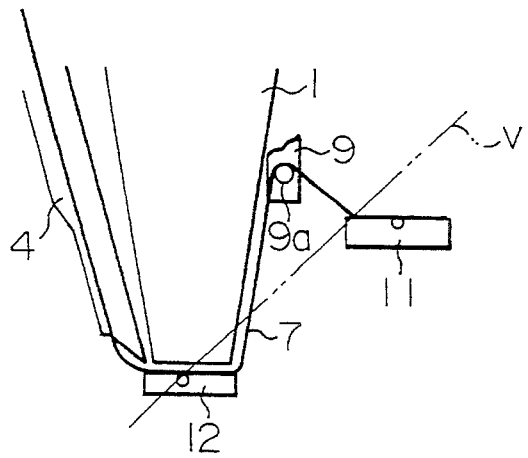
FIG. 7 is an illustration of a further step of the wire bonding process.

Then, as shown in FIG. 6, the nozzle 1 is lowered so that the copper wire 7 is pressed between the upper face of the terminal 11 and the lower face of the nozzle 11 thereby being located. In this state, a laser beam is emitted to weld the copper wire 7 to the terminal 11.

Subsequently, the forming member 9 is moved so that its cylindrical portion 9 is located at a wire detouring position which is between the pad 12 and the terminal 11 when viewed from the upper side and which is at a level above the level of the terminal 11. The nozzle 1 and the cutter 4 is then moved over the cylindrical portion 9a of the forming member 9 so as to be located on the pad 12. During this movement of the cutter 4, the copper wire 7 is continuously pulled out the cutter 4 so that the copper wire 7 is laid around the cylindrical portion 9a of the forming member 9. The nozzle 1 is then lowered so that the copper wire 7 is clamped and fixed between the lower face of the nozzle 1 and the upper face of the pad 12. The laser beam 3 is emitted in this state so that the copper wire 7 is welded to the pad 12.

Thus, the copper wire 7 is laid along a route which is above an imaginary straight line interconnecting the terminal 11 and the pad 12 and which passes the detouring point above the levels of the terminal 11 and the pad 12.

Figure 8:
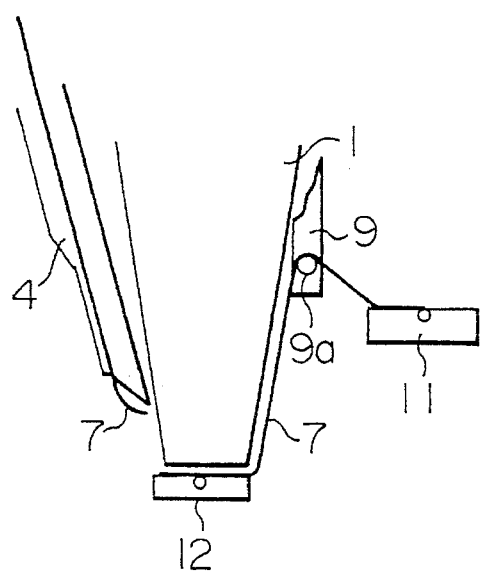
FIG. 8 is an illustration of a further step of the wire bonding process.

Subsequently, the cutter 4 which is not clamping the copper wire 7 is moved downward as shown in FIG. 8 so as to cut the copper wire 7. The cutter 4 then clamps the copper wire 7 and moves upward. In this state, an upwardly convex portion of the copper wire 7 has been formed in the region which is between the terminal 11 and the pad 12 as viewed in plan, because the copper wire 7 has been wound around the cylindrical portion 9a of the forming member 9.

Figure 9:
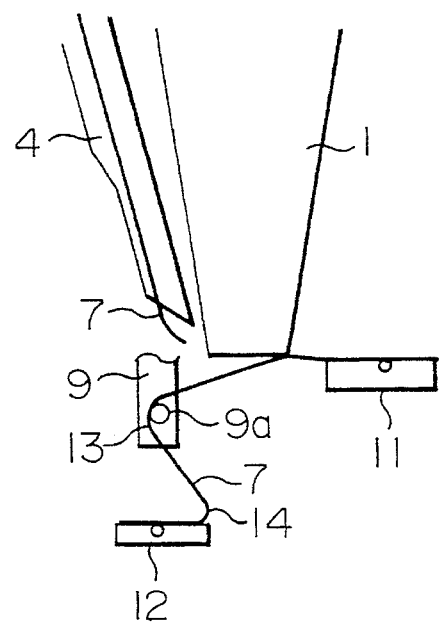
FIG. 9 is an illustration of a further step of the wire bonding process.

Then, the nozzle 1 is temporarily raised and moved downward again as shown in FIG. 9, so as to depress the upwardly convex portion of the copper wire 7 to cause a plastic deformation of the copper wire, thereby locating the convex curved portion of the copper wire 7 at a level below the level of the terminal 11. At the same time, the forming member 9 is moved downward and leftward so as to finally form acute bends: a first acute bend 13 and a second acute bend 14, and, at the same time, to check the strength of the thus formed copper wire. It will be understood that the first and second acute bends are formed by application of a lateral pulling force exerted by the cylindrical portion 9a.

Wire bonding is thus completed fully automatically to obtain the final shape of the bonding wire 7 as shown in FIG. 10. In this wire-bonded structure, the bonding wire 7 is laid in a substantially S- or Z-shape in the region between the pad 12 and the terminal 11. More specifically, the copper wire 7 is extended from the terminal 11 to the left and is bent at an acute angle to form the first acute bend 13 and further bent at an acute angle so as to form the second acute bend 14 so as to reach the pad 12. The first and second acute bends 13, 14 are formed such that the first acute bend 13 is disposed above the point where the copper wire 7 is bonded to the pad 12.

The described operation is cyclically repeated to wirebond the successive terminals to the associated pads, thus forming a desired number of wire bonds.

Figure 12:
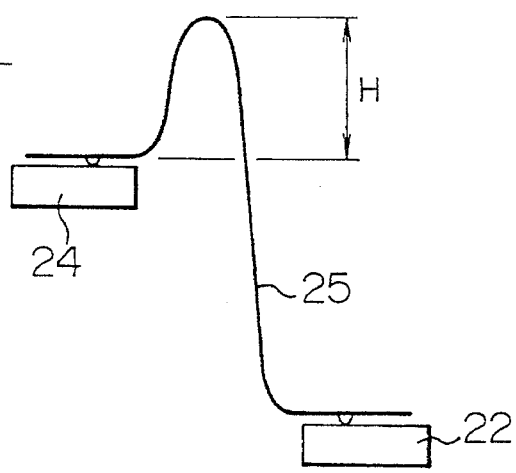
FIG. 12 is an illustration of another conventional wire bonding method.
Figure 13:
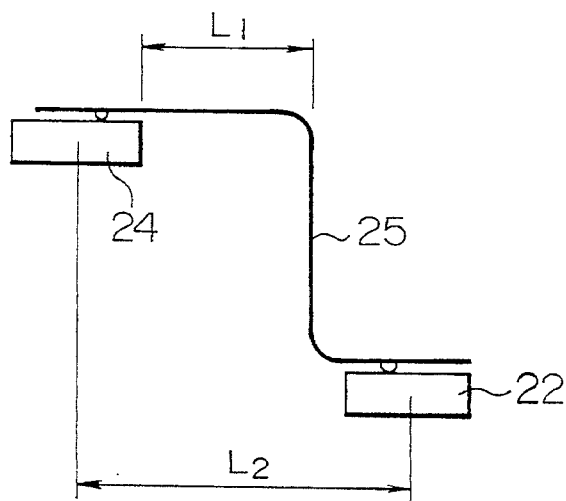
FIG. 13 is an illustration of still another conventional wire bonding method.

In the wire bonded structure formed in this embodiment as shown in FIG. 10, the bonding wire 7 is laid in the vertical region between the pad 12 (connecting electrode) and the terminal 11 (external lead terminal) such that the wire 7 is extended from the terminal, bent at an acute angle at the first acute bend 13, bent back at the second acute bend 14 and then extended to the pad 12. Consequently, the vertical slack H which hitherto has been necessary in the conventional arrangement as shown in FIG. 12 can be eliminated, thus enabling saving of the space. When the slack is formed only horizontally as in the conventional arrangement shown in FIG. 13, the horizontal distance $L_2$ between the connecting electrode 22 and the external lead terminal 24 is increased as explained before. In contrast, in the described embodiment of the present invention, the horizontal distance between the pad 12 and the terminal 11 can be reduced by virtue of the presence of two acute bends 13 and 14, whereby enlargement of the package size can be avoided. In particular, it is important that the first bend 13 is located in the space right above the pad 12 which is disposed at a level below the level of the terminal 11, because such an arrangement realizes a remarkable reduction in the package size.

It is also important that the copper bonding wire 7 is laid so as to intersect an imaginary straight line V interconnecting the weld point on the pad 12 and the outer edge of the terminal 11, in order that the copper wire 7 having a length greater than that of the above-mentioned straight line V is accommodated in the space between the terminal 11 and the pad 12.

As will be understood from the foregoing description, the wire boding method of the illustrated embodiment has the steps of: welding one end of a ribbon shaped flat copper wire 7 to the terminal 11 (external lead terminal); welding the other end of the copper wire 7 to the pad 12 (connecting electrode) which is disposed at a level below the level of the terminal 11, while winding the intermediate portion of the copper wire 7 around the cylindrical portion 9a of the forming member 9 which is disposed at a level above the terminal 11 within the horizontal span between the pad 12 and the terminal 11; and depressing the bent portion of the copper wire 7 which has been bent by being wound around the cylindrical portion 9a of the forming member 9 down to a level below the level of the terminal 11 so that the copper wire 7, within the vertical span between the pad 12 and the terminal 11, is bent to form the first acute bend 13 and then bent back to form the second acute bend 14 and then extended to the pad 12.

It is therefore possible to locate the portion of the copper wire 7 forming the first bend 13 right above the weld point where the wire 7 is welded to the pad 12 as shown in FIG. 10, thus realizing a compact construction of the package.

Although the invention has been described through its preferred form, it is to be understood that the described embodiment is only illustrative and various changes and modifications may be imparted thereto without departing from the scope of the invention.

For instance, the invention does not exclude the use of a wire having a circular cross-section in place of the ribbon shaped flat wire used in the described embodiment.

The wire bonding method of the described embodiment may be modified such that the bonding wire 7 is welded first to the pad 12 and then to the terminal 11. The described wire bonding method also can be applied to a case where the pad 12 is disposed at a level above the level of the terminal 11.

Thus, the present invention enables efficient use of the limited space while reducing the overall package size, while making it possible to realize fully automatic wire bonding between connecting electrodes on a circuit board and the associated external lead terminals.

What is claimed is:

1. A wire bonding apparatus for laying a wire between spaced first and second connecting terminals so as to electrically interconnect both electrodes, comprising:

wire supplying means for supplying said wire and laying said wire between said first and second electrodes;

welding means for welding said wire to said connecting electrodes;

and a wire forming means the position of which is adjustable independently from said wire supplying means, said wire forming means being located at a detouring position spaced apart from an imaginary straight line interconnecting said first and second electrodes and retains a portion of said wire laid between said first and second electrodes, said wire forming means being movable, after said wire is laid between said first and second connecting electrodes, so as to bring said portion of said wire from said detouring position to a position near said imaginary line, such that said wire is connected between said first and second connecting electrodes so as to have at least one bend.

2. A wire bonding apparatus according to claim 1, wherein said wire forming means has a guide member for retaining said wire, and wherein said wire supplying means has an end which is movable while supplying said wire, over from said guide member from a position which is under and at one lateral side of said guide member to a position which is under and at the other lateral side of said guide member.

3. A wire bonding apparatus according to claim 2, wherein said welding means has a nozzle capable of pressing said wire.

4. A wire bonding apparatus according to claim 3, wherein said guide member is movable so as to laterally pull said wire while said wire is being pressed by said nozzle.

5. A wire bonding method for electrically interconnecting first and second connecting electrodes which are spaced a predetermined distance from each other, said method comprising:

a wire laying step in which said wire is laid between said first and second connecting terminals via a detouring point which is spaced apart from a imaginary straight line interconnecting said first and second connecting terminals;

and a deforming step in which said wire is displaced from said detouring point to a position near said imaginary straight line so that said wire is placed between said first and second connecting terminals so as to have at least one bend.

6. A wire bonding method according to claim 5, further comprising a first connecting step in which said wire is electrically connected at its one end to said first connecting electrode.

7. A wire bonding method according to claim 6, further comprising a second connecting step in which said wire is electrically connected at its other end to said second connecting electrode.

8. A wire bonding method according to claim 7, wherein said first connecting step, said wire laying step, said second connecting step and said deforming step are executed in the mentioned order.

9. A wire bonding method according to claim 5, wherein said wire is a ribbon shaped wire.

10. A wire bonding method according to claim 5, wherein said deforming step is conducted such that said wire is positioned between said first and second connecting terminals so as to have a substantially S- or Z-shape with at least two bends.

11. A wire bonding method according to claim 10, wherein said bends are formed by portions of said wire bent at acute angles not greater than 90°.

12. A wire bonding method according to claim 5, wherein said first connecting electrode and said second connecting electrode are spaced predetermined distances from each other both in horizontal and heightwise directions, and said wire laying step is executed such that said detouring point is above said imaginary straight line.

13. A wire bonding method according to claim 12, wherein said wire laying step is executed such that said detouring point is above the levels of said first and second connecting electrodes.

14. A wire bonding method according to claim 5, wherein said wire laying step includes the steps of:

positioning a guide member at said detouring point; and laying said wire while turning said wire around said guide member.

15. A wire bonding method according to claim 14, further comprising:

connecting step for electrically connecting said wire to said first and second connecting electrodes by a nozzle respectively; and wherein said deforming step is executed after said connecting step, by pressing down said wire by said nozzle used in said connecting step and then moving said guide member so as to laterally pull said wire thereby deforming said wire.

* * * * *